United States Patent [19]

Conner et al.

[11] Patent Number: 4,727,409

[45] Date of Patent: Feb. 23, 1988

[54] PROGRAMMABLE READ-ONLY MEMORY FORMED WITH OPPOSING PN DIODES

[75] Inventors: George W. Conner, Ben Lomond; Ronald L. Cline, Los Gatos, both of Calif.

[73] Assignee: Signetics Corporation, Sunnyvale, Calif.

[21] Appl. No.: 763,063

[22] Filed: Aug. 5, 1985

Related U.S. Application Data

[63] Continuation of Ser. No. 367,500, Apr. 12, 1982, abandoned.

[51] Int. Cl.⁴ .............................. H01L 29/04
[52] U.S. Cl. ........................ 357/59; 365/96; 365/103; 365/105
[58] Field of Search ............ 357/59 A; 365/96, 103, 365/105

[56] References Cited

U.S. PATENT DOCUMENTS

| | | | |
|---|---|---|---|
| 3,992,232 | 11/1976 | Kaji et al. ............... | 357/50 |
| 4,099,260 | 7/1978 | Lynes et al. . | |
| 4,198,649 | 4/1980 | Berry ..................... | 357/49 |
| 4,229,757 | 10/1980 | Moussie ................ | 365/105 |
| 4,403,399 | 9/1983 | Taylor .................... | 357/45 |
| 4,418,468 | 12/1983 | Vora et al. ............. | 357/50 |
| 4,480,318 | 10/1984 | Chong ................... | 365/105 |
| 4,624,046 | 11/1986 | Shideler ................ | 357/34 |

FOREIGN PATENT DOCUMENTS

| | | | |
|---|---|---|---|
| 7632739 | 5/1978 | France . | |
| 0127061 | 10/1980 | Japan ..................... | 357/50 |
| 56-24968 | 3/1981 | Japan ..................... | 365/103 |
| 0048170 | 5/1981 | Japan ..................... | 357/50 |
| 0083058 | 7/1981 | Japan ..................... | 357/45 |
| 2005079 | 4/1979 | United Kingdom . | |

OTHER PUBLICATIONS

IBM Tech. Disclosure Bulletin, vol. 23, #12, pp. 5388-5389, May 1981, by Jambotkas.
Electronics, Feb. 28, 1982, "16K-PROM Uses Vertical Fuses", p. 184.
M. Grossman, "Recessed-Oxide Isolation Hikes IBM's LSI Density and Speed", *Electronic Design*, Jun. 7, 1979, pp. 26-28.

Primary Examiner—Andrew J. James
Assistant Examiner—Mark Prenty
Attorney, Agent, or Firm—R. J. Meetin; R. T. Mayer; J. Oisher

[57] ABSTRACT

A semiconductor PROM contains a group of PROM cells (12) each consisting of a pair of opposing diodes oriented vertically with their common intermediate region (22 and 24) fully adjoining a recessed oxide insulating region (16). The PN junction (30) of the upper diode of each pair lies in non-monocrystalline semiconductor material. A composite buried layer consisting of buried regions (32) which adjoin the insulating region below the lower cell regions (20) and a buried web (44) which laterally surrounds each buried region is employed to improve programming efficiency as well as provide intermediate electrical connections.

20 Claims, 16 Drawing Figures

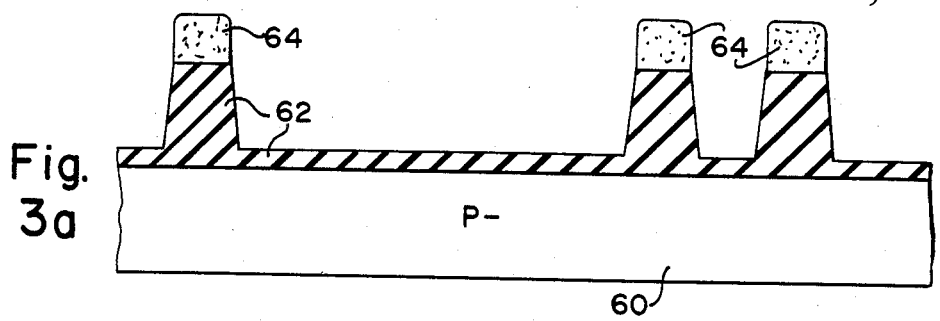
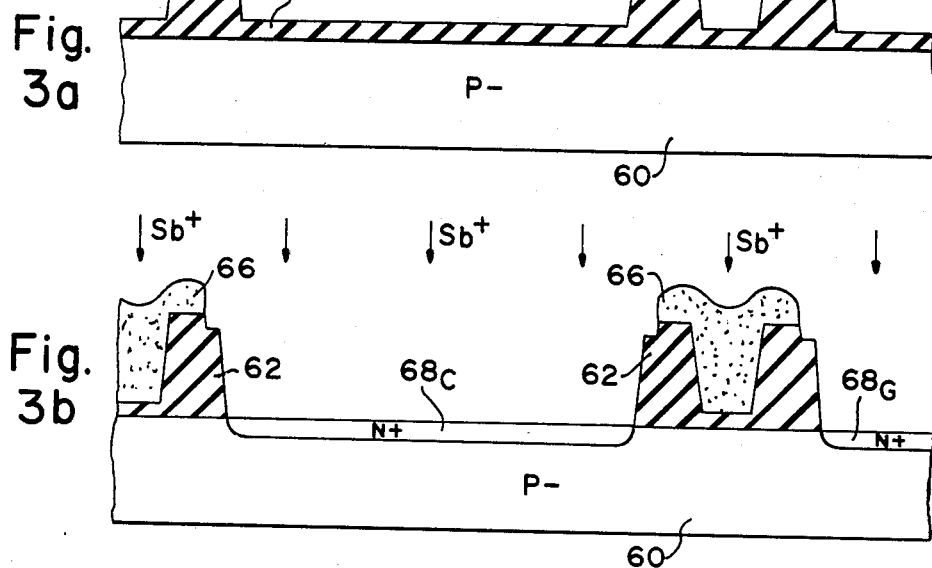
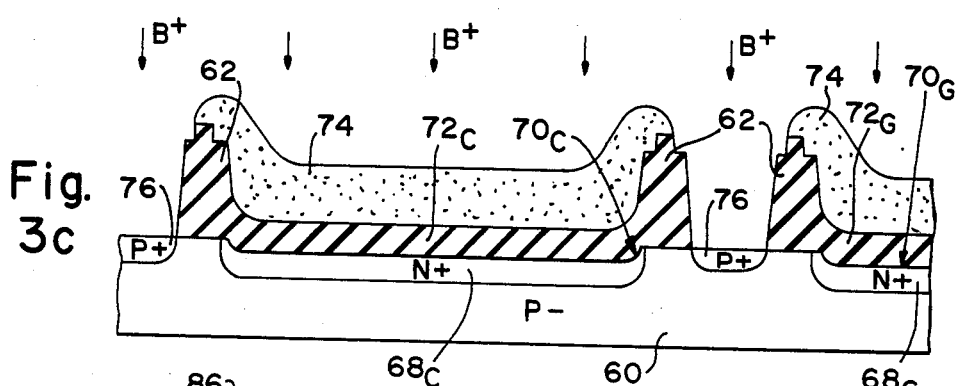
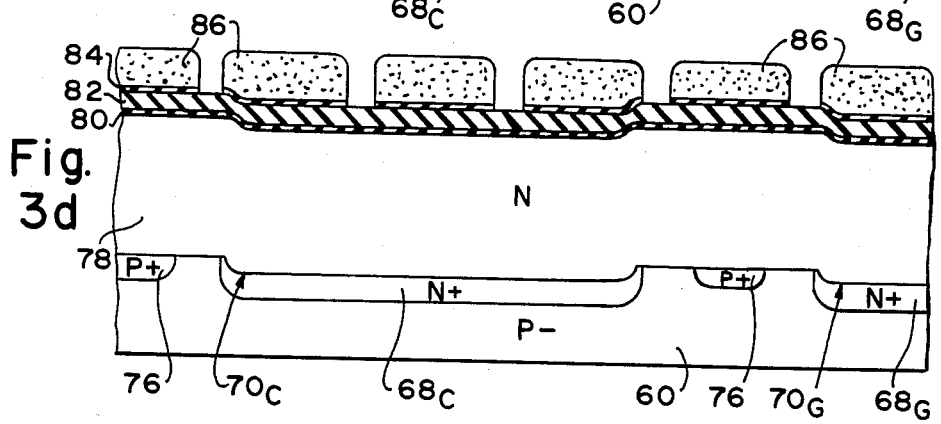

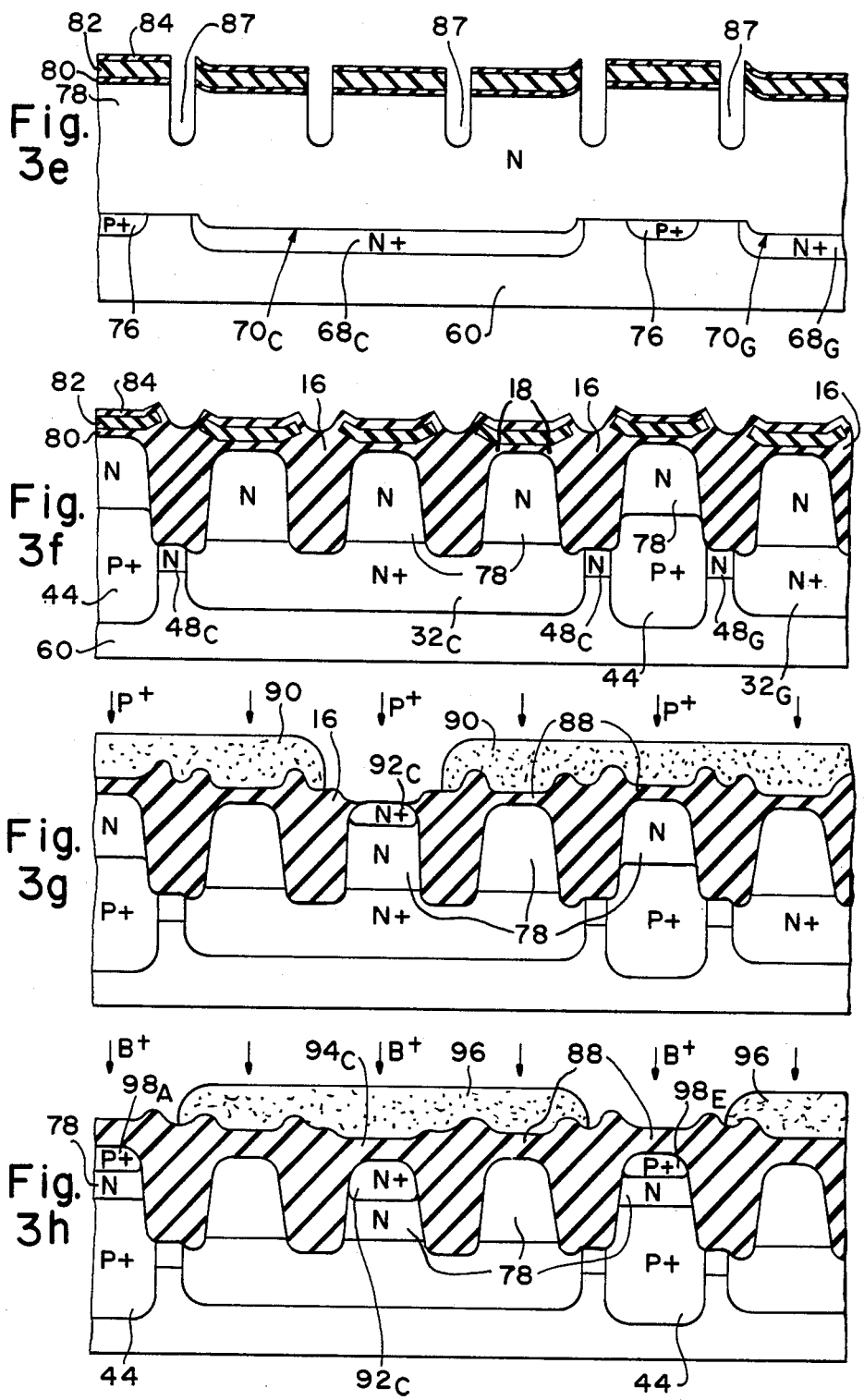

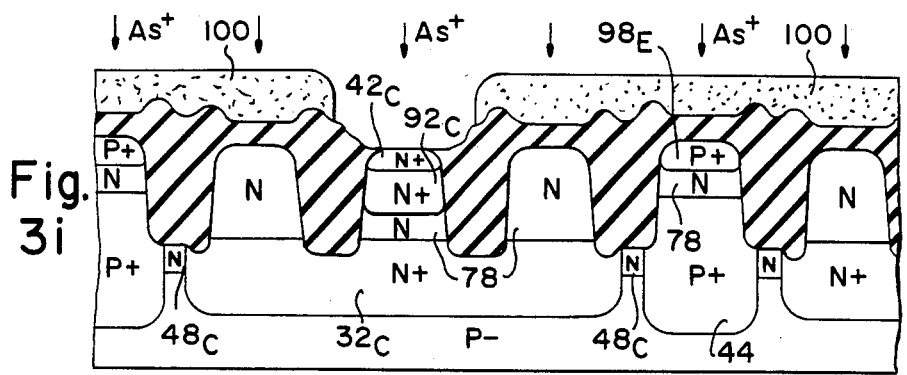
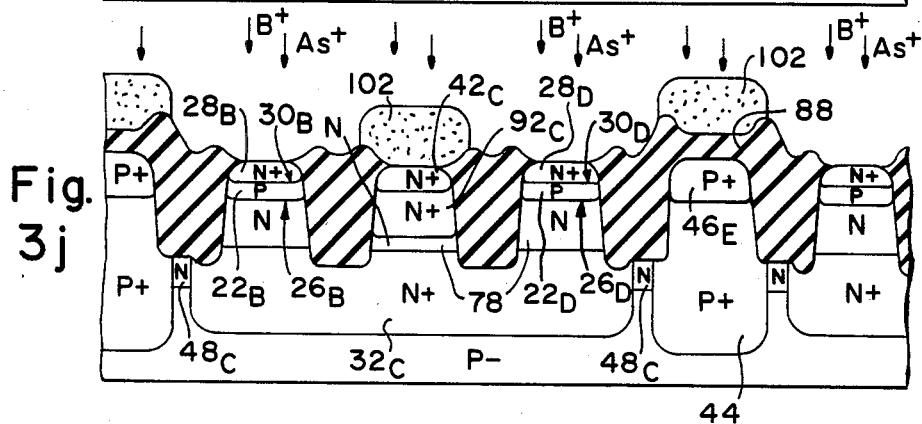
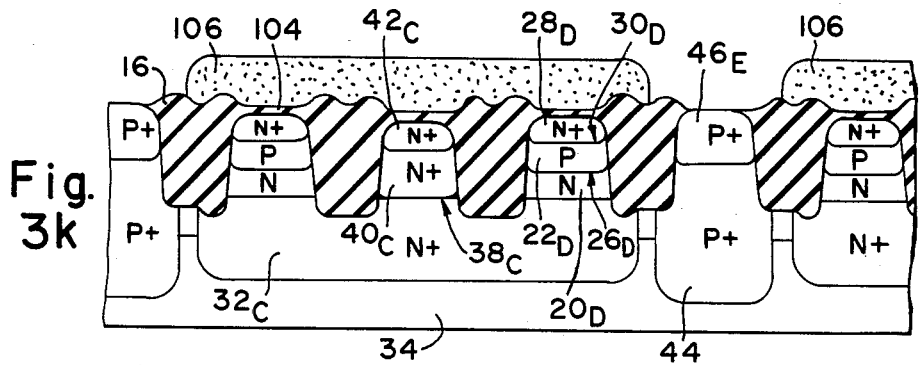
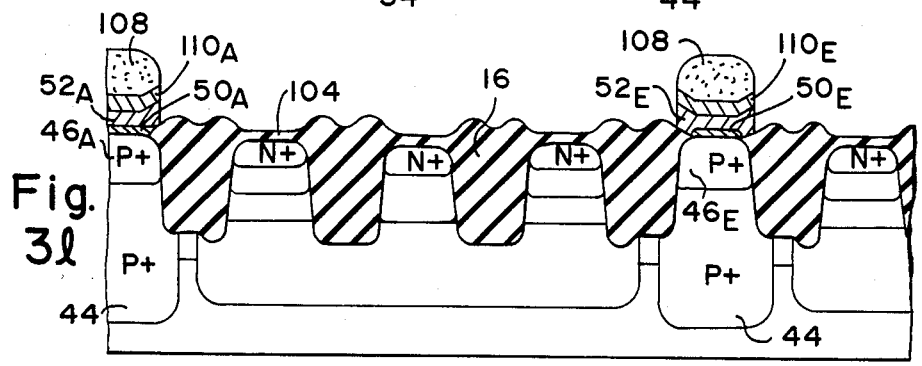

PROGRAMMABLE READ-ONLY MEMORY FORMED WITH OPPOSING PN DIODES

This is a continuation of U.S. patent application, Ser. No. 367,500, filed Apr. 12, 1982, now abandoned.

FIELD OF USE

This invention relates generally to a semiconductor programmable read-only memory (PROM) and more particularly to a cellular PROM in which each PROM cell contains a pair of opposing diodes, one of which can be selectively destroyed to program the memory.

BACKGROUND ART

PROM's are becoming increasingly important in field-programmable electronic memory applications. Of particular importance is the type of PROM containing an array of rows and columns of memory cells that each consist of a pair of back-to-back PN junction diodes. A first of the diodes in each cell serves as an array element for electrically isolating the cell while the second diode is selectively destructible for programming a logical "0" or a logical "1" into the cell. The programmable diode is typically destroyed by forcing a sufficiently high reverse current to flow through its PN junction so as to permanently short circuit this junction.

Electrically insulating material such as silicon dioxide is employed in laterally separating the memory cells in some prior art PROM's using the back-to-back diode configuration. In U.K. Pat. publication No. 2005079A, "Programmable read-only memory cell", correspondig to U.S. Pat. No. 4,229,757, M. Moussie discloses such a PROM in which each array diode is a vertical diode with its PN junction lying horizontally in a monocrystalline silicon region of a semiconductor body and fully laterally adjoining a deep (or recessed) region of silicon dioxide in the body. Each programmable diode is a horizontal diode with its PN junction located in a region of polycrystalline silicon adjoining the monocrystalline region along its upper surface. The PN junction of each programmable diode extends generally perpendicular to the lower surface of the body. This PROM is fabricated by forming an N-type epitaxial layer on the upper surface of a P-type substrate and then forming a P-type epitaxial layer on the N-type epitaxial layer. A deep N-type region contacts the bottom surface of the deep oxide region which is formed around portions of the epitaxial layers to create the array diodes. At each cell there is an aperture through an insulating layer covering the P-type epitaxial layer. The PN junctions for the programmable diodes are formed in a layer of polycrystalline silicon deposited on the insulating layer and on the portions of the P-type epitaxial layer exposed by the apertures. Even though comparatively small currents of about 20 ma are needed to program this PROM, its horizontal diodes increase cell area.

DISCLOSURE OF THE INVENTION

A PROM formed in a semiconductor body having a recessed electrically insulating region, which preferably consists of a semiconductor oxide, and an adjoining monocrystalline semiconducting region contains a group of PROM cells laterally separated from one another along an upper surface of the semiconducting region. Each cell has a substantially horizontal first PN junction lying in the semiconducting region and a corresponding second PN junction that together form a pair of PN junction diodes in an opposing configuration. Each second PN junction is substantially horizontal and lies in a corresponding further region of the body downwardly adjoining the semiconducting region above the corresponding first PN junction in such a manner that the intermediate cell region between each pair of PN junctions fully adjoins the insulating region which extends at least partly above the upper surface. Preferably, each further region is substantially polycrystalline semiconductor material.

"Substantially horizontal" as applied to the PN junctions means that each of them largely lies in a plane parallel to a substantially flat bottom surface of the semiconductor body. Each junction is "substantially horizontal" even if it turns slightly upward or downward where it adjoins the insulating region. In this manner, both diodes in each PROM cell are vertical diodes. The lower diode defined by the first PN junction is normally the array element while the upper diode defined by the second PN junction is normally the programmable element. By having the PN junctions in each cell fully adjoin the insulating region, the present PROM takes up very little space. The memory element in each cell typically occupies approximately 2.25 micron$^2$ which is significantly less than in comparable prior art devices.

The lower cell regions directly below the first PN junctions are of a first conductivity type while the intermediate cell regions are of an opposite second conductivity type. Normally, the cells are formed above a substrate region of the second conductivity type. This creates a potential problem in that the substrate region acts as the collector for a parasitic transistor in which the lower region of each cell serves as the base, and the adjoining intermediate cell region is the emitter. When the second PN junction of that cell is destroyed, its first PN junction becomes forward biased which causes the associated parasitic transistor to turn on. The current injected by the parasitic transistor into the substrate region could build up the voltage there sufficiently to cause the PN junctions between the substrate and the lower cell regions of other cells along the same column to become forward biased. In turn, this can degrade the second PN junctions of these other cells.

A composite buried layer is suitably employed to alleviate this problem and also to provide intermediate electrical connections to the lower cell regions. This buried layer includes a plurality of highly doped buried regions of the first conductivity type directly below the lower cell regions. Each buried region adjoins the insulating region along the entire lower edge of the lateral periphery of each of one or more associated lower cell regions. By having the buried regions meet the insulation region, the amplification of each parasitic transistor is substantially reduced, typically by a factor of 100. As a result, the voltage achieved in the substrate region during programming of one cell is substantially reduced so as to protect the programmable diodes in other cells along the same column.

The composite buried layer also includes a highly doped buried web of the second conductivity type laterally surrounding each buried region. The buried web provides a low resistance path for removing charge carriers injected into the substrate region by the parasitic transistors during programming so as to further prevent the substrate potential from building up.

The buried web is laterally separated from the buried regions by a lowly doped region which includes the substrate region and extends up to the insulating region. The lowly doped region serves to increase the breakdown voltage of the substrate PN junctions to an acceptable value.

An important advantage of the present memory is that it is highly insensitive to many material and process-induced defects. Only the actual memory element area of each cell is significantly subject to such defects, and this area is quite small. Connections extending through the insulation region to the composite buried layer are largely insensitive to many of these defects, while many of the PN junctions are partially or wholly protected by the insulating region. Accordingly, this PROM is particularly suitable for the manufacture of very large memory arrays.

In fabricating the PROM, the insulating region is first formed in such a manner as to fully adjoin the entire lateral boundary of each of a group of monocrystalline portions of a doped region of the first conductivity type spaced apart from one another along the top surface of the doped region and to extend at least partly above the top surface. A dopant of the second conductivity type is introduced through the top surface into the monocrystalline portions to define the first PN junctions. The insulation region is preferably employed as a mask to control the lateral extent of the dopant of the second conductivity type in each monocrystalline portion. The second PN junctions are then defined by forming the further regions on the monocrystalline portions in such a manner that each further region has an upper part of the first conductivity type and an adjoining lower part of the second conductivity type.

The composite buried layer and the insulating region are normally formed at an earlier point in the manufacture of the PROM. An impurity of the first conductivity type is selectively introduced into a monocrystalline semiconductor substrate of the second conductivity type at a plurality of first locations spaced apart from one another along a surface of the substrate to lay out the buried regions. Preferably, the buried web is likewise laid out by selectively introducing an impurity of the second conductivity type into the substrate at a second location laterally surrounding and spaced apart from each of the first locations. An epitaxial semiconductor layer is then grown on the surface of the substrate. A web-like portion of the epitaxial layer is removed along its upper surface to create a groove. The substrate and the remainder of the epitaxial layer are then selectively subjected to a high-temperature oxidizing environment to oxidize part of the epitaxial layer along the groove so as to form the insulation region and to cause parts of the impurities introduced into the substrate to diffuse upward into the epitaxial layer to form the composite buried layer.

BRIEF DESCRIPTION OF THE DRAWINGS

FIGS. 3a—3m are cross-sectional side views illustrating steps in the manufacturing procedure leading to the embodiment of FIGS. 1, 2a, and 2b. The cross-section of each of FIGS. 3a—3m corresponds to the cross-section of FIG. 2a.

Like reference symbols are employed in the drawings and in the description of the preferred embodiments to represent the same or very similar item or items. For convenience in illustration, the dimensions in the drawings are generally not drawn to scale.

DESCRIPTION OF THE PREFERRED EMBODIMENT

Figure 1:
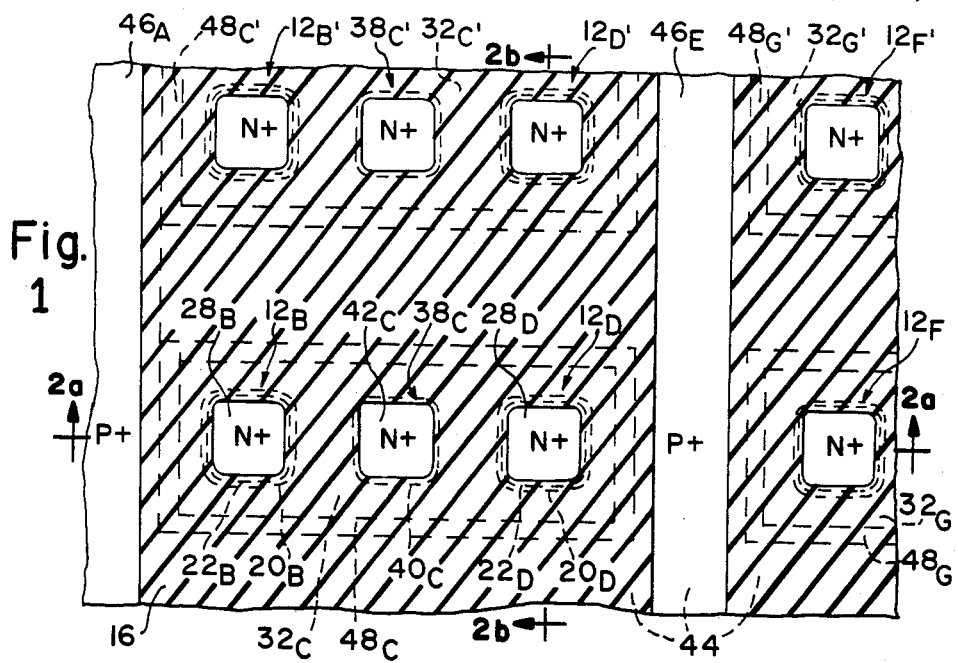
FIG. 1 is a cross-sectional layout view of an embodiment of a PROM in accordance with the invention taken through the plane 1—1 in FIGS. 2a and 2b.
Figure 2A:
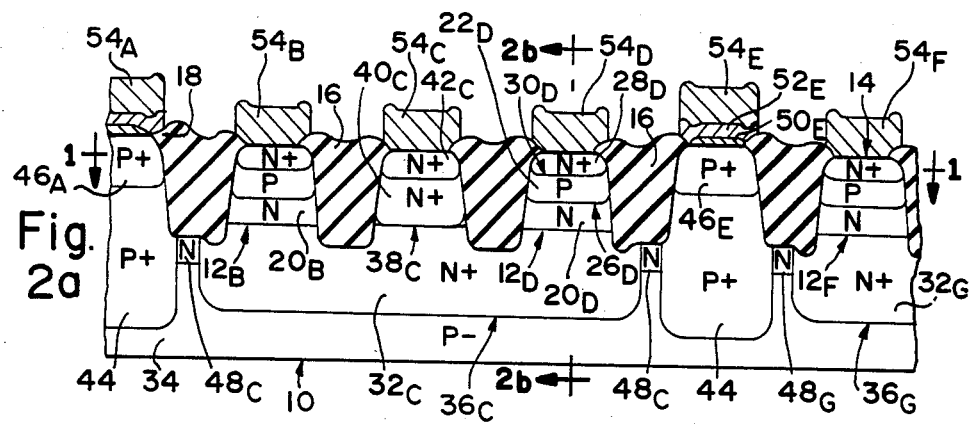
FIGS. 2a and 2b are cross-sectional side views of the embodiments of FIG. 1 taken through the planes 2a—2a and 2b—2b, respectively, in FIG. 1.
Figure 2B:
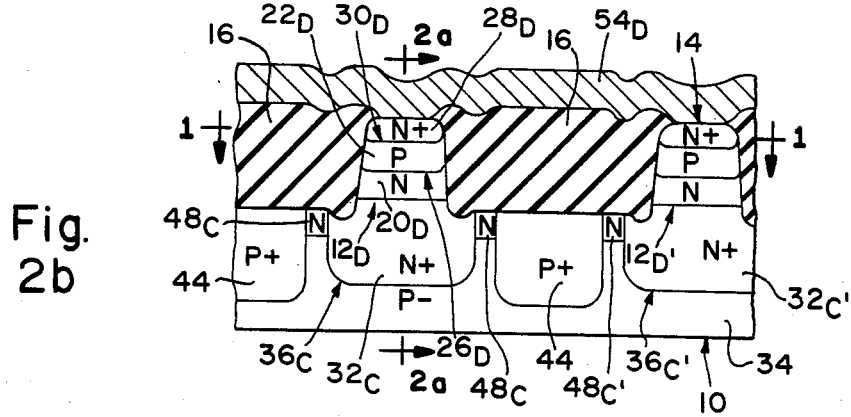

Referring to the drawings, FIG. 1 illustrates a cross-sectional layout view of a preferred embodiment of a PROM containing a group of identical PROM cells each consisting of a pair of back-to-back oxide-walled vertical diodes. FIGS. 2a and 2b are mutually perpendicular cross-sectional side views of the embodiment of FIG. 1 showing the structure of the PROM in a semiconductor body having a flat bottom surface 10. As shown in FIGS. 2a and 2b, the cross-section of FIG. 1 is taken through the plane 1—1 parallel to bottom surface 10. The elements shown in dotted lines in FIG. 1 lie below plane 1—1. The terms "lower", "bottom", "upper", "top", "below", "above", "vertical", "horizontal", and "lateral" are defined for convenience with respect to the orientation of the semiconductor body when surface 10 is parallel to the ground.

The PROM cells are arranged in an array of rows and columns. The rows are about 20 microns apart.

Six PROM cells $2_B$, $12_D$, $12_F$, $12_{B'}$, $12_{D'}$, and $12_{F'}$ are shown in FIG. 1. Cells $12_B$, $12_D$, and $12_F$ lie in one row while cells $12_{B'}$, $12_{D'}$, and $12_{f'}$ lie directly across in an adjacent row. In this manner, each subscript "B", "D", or "F" identifies a particular column, the unprimed notation denotes the row shown in FIG. 2a, and the primed notation indicates the adjacent row. Some of the inter-column regions as well as the regions centering on the inter-column regions are identified by reference symbols containing the corresponding alternating subscripts "A", "C", "E", and "g". In referring to an arbitrary one of cells $12_B$, $12_D$, $12_F$, $12_{B'}$, $12_{D'}$, and $12_{F'}$, their components, or separate column elements differentiated by the subscripts "B", "D", or "F" or to an arbitrary one of the regions whose reference symbols contain the subscripts "A", "C", "E", and "G", the subscripts "A" through "G" as well as the primed notation will generally be dropped in the present description even though they are shown as part of the complete reference symbols in the drawings. In addition, the components of some of cells 12 are not labelled or are only partially labelled in the drawings so as to avoid excessive labelling. For example, only the components of cell $12_D$ are completely labelled in FIGS. 2a and 2b.

Lower portions of cells 12 are formed in a doped monocrystalline silicon region of the body along an upper surface 14 of the monocrystalline region and are laterally separated from one another by adjoining portions of a recessed web-like electrically insulating region 16 of silicon dioxide which is selectively sunk in the body along surface 14. The monocrystalline region in FIGS. 2a and 2b is that portion lying between surfaces 10 and 14 excluding insulation region 16. The center-to-center spacing of parts of oxide isolation region 16 on opposite sides of any cell 12 along a row is about 11 microns. Oxide region 16 has bird beaks 18 which encroach into the monocrystalline region causing each cell 12 to neck down along surface 14 to a cross-sectional area of about 2.25 micron$^2$. The crests of oxide region 16 extend about 0.4 microns above surface 14. Measured from upper surface 14, the lowest surface of oxide region 16 is about 1.1 microns into the body.

Each cell 12 consists of a lower array diode and an upper programmable diode. The array diode is a vertical PN-junction element formed by a lower N region 20 and a composite intermediate P region consisting of a P region 22 in the monocrystalline region and a P region 24 which is polycrystalline silicon and adjoins P region 22 along surface 14. The common interface of N region 20 and P region 22 defines a first PN junction 26 having a lateral area of about 4 micron$^2$ and a breakdown voltage of about 20 volts. Each P region 24 is part of a corresponding polycrystalline silicon region whose remaining part is an upper N+ polycrystalline region 28. The programmable diode is a vertical PN-junction element consisting of composite P region 22 and 24 and N+ region 28 whose common interface is a second PN junction 30 having a lateral area of about 3 micron$^2$ and a breakdown voltage of about 8 volts. The greater area of junction 26 acts to prevent it from being degraded when the programmable diode is being programmed.

P region 22 fully adjoins the recessed sidewalls of insulation region 16 so that PN junction 26 likewise fully adjoins the sidewalls. Similarly, P region 24 fully adjoins bird beak 18 so that PN junction 30 fully adjoins oxide region 16. Each PN junction 26 or 30 is horizontal across most of its extent but typically turns upward or downward near where it adjoins oxide region 16. Inasmuch as the center of each junction 26 or 30 is parallel to lower surface 10, and the portion of junction 26 or 30 that turns upward or downward is quite small, junctions 26 and 30 are appropriately characterized as "substantially horizontal".

Cells 12 are formed as the upper part of a structure in which electrical connections must be provided between lower N regions 20 and the row lines of the PROM. The lower part of the structure originally consists of a lowly doped P-type semiconductor substrate. In the absence of a buried layer having heavily-doped N-type and P-type regions, each P region 22 (and 24) acts as the emitter for a vertical parasitic PNP transistor whose base is the adjoining N region 20 and whose collector is the remaining lowly doped P-type portion of the substrate.

During cell programming, the potential of all N+ regions 28 along a particular column is raised by raising the potential of the column line connected to those N+ regions 28. When any particular cell 12 such as cell 12$_D$ is being programmed, its PN junction 30$_D$ is avalanched, forcing current into its P region 22$_D$ (and 24$_D$) and through its PN junction 26$_D$ which is forward biased. This can turn on the parasitic PNP transistor associated with that cell 12$_D$. The base-collector junction for this vertical parasitic transistor is the base-emitter junction for a lateral parasitic NPN transistor whose base-collector junction is formed by the remaining lowly doped P-type substrate portion and N region 20 of any other cell 12 such as cell 12$_{D'}$ along the same column.

When the parasitic PNP transistor saturates, its base-collector junction forward biases to raise the substrate voltage to turn on the lateral NPN transistor. This brings the voltage of N region 20$_{D'}$ down to nearly that of N region 20$_D$ and can degrade PN junction 30$_{D'}$ since N+ region 28$_{D'}$ is at the same potential as N+ region 28$_D$. In short, the action of the parasitic PNP transistor associated with each cell 12 being programmed can damage the programmable diodes of other cells 12 along the same column. A composite buried layer is utilized with cells 12 to alleviate this problem, to provide intermediate electrical connections to the word lines, and to provide further electrical isolation between the rows.

One part of this composite buried layer consists of a set of buried N+ regions 32 that lie directly below lower N regions 20 and contact the lower surface of oxide region 16. Most preferably, each buried region (or tub) 32 is continuous with four of lower regions 20. However, for convenience in illustration, each tub 32 in FIGS. 1, 2a, and 2b is indicated as being continuous with only two of lower regions 20. For example, buried region 32$_C$ is depicted as being continuous with lower regions 20$_B$ and 20$_D$. As a result, each particular tub 32 adjoins insulating region 16 along the entire lower edge of the lateral periphery of each lower region 20 that is continuous with the particular tub 32.

The average net dopant concentration in buried regions 32 is about $1.6 \times 10^{18}$ atoms/cm$^3$. Lower regions 20 have a relatively uniform net dopant concentration of about $8 \times 10^{15}$ atom/cm$^3$ which is what tubs 32 drop to along oxide regions 16 where they meet regions 20 about 1.0 micron below upper surface 14. Buried regions 32 extend downward from surface 14 about 4 microns into the body.

Each of tubs 32 extends into a lowly doped P-substrate region 34 whose lower boundary is surface 10 to form a corresponding isolation PN junction 36 which is normally reverse biased. P- region 34 has a relatively uniform net dopant concentration of about $1 \times 10^{15}$ atoms/cm$^3$. This is also the N-type dopant concentration that buried regions 32 fall to along isolation junctions 36.

Isolation junctions 36 are the base-collector junctions for the parasitic PNP transistors that can turn on during programming. Since each buried region 32 fully adjoins oxide region 16 around each associated cell 12, N+ tubs 32 form part of the bases of the parasitic PNP transistors. This reduces their current amplification from about 10 in the absence of tubs 32 to about 0.1. When one of cells 12 is being programmed, the reduced amplification reduces the voltage that can be built up in substrate region 34 and thereby prevents degradation of the programmable diodes of other cells 12 in the same column.

Each buried region 32 is connected with upper surface 14 by a corresponding composite N+ region 38 consisting of a lower N+ region 40 and an upper N+ region 42. The combination of N+ regions 32 and 38 provides the necessary intermediate connections between lower cell regions 20 and the row lines. The high doping in each buried region 32 serves to reduce the series resistance between its connective region 38 and its lower cell regions 20. Connective regions 38 also provide low resistance paths to surface 14 to reduce the parasitic voltage drops that occur during cell programming.

The other part of the composite buried layer is a buried P+ web 44 which laterally surrounds each of buried N+ regions 32. Buried web 44 adjoins insulation region 16 along its lower surface and extends partly up its sidewalls. The average net dopant concentration in P+ web 44 is approximately $7 \times 10^{17}$ atoms/cm$^3$. Buried web 44 has a net dopant concentration of about $1 \times 10^{17}$ atom/cm$^3$ where it meets the lower surface of oxide region 16, while its P-type dopant concentration drops to that of substrate region 34 about 3.5 microns below surface 14.

P+ web 44 is connected with upward surface 14 by a plurality of low resistivity P+ regions 46 which extend along the columns in the PROM. Insulation region 16 and buried web 44 in combination with connective regions 46 laterally electrically isolate cells 12 of any particular tub 32 from cells 12 of all other tubs 32. Consequently, this combination laterally isolates the rows from one another. Web 44 in combination with connective regions 46 also provides a low resistance path for removing holes collected during cell programming by PNP parasitic collector region 34. This serves to further prevent the programming of one of cells 12 from damaging the programmable diodes in other cells 12 along the same column.

Each buried region 32 is laterally separated from buried web 44 by a corresponding lowly doped region that consists of P- substrate region 34 and a corresponding epitaxial N region 48 that lies between region 34 and the lower surface of oxide region 16. N regions 48 each have a relatively uniform net dopant concentration of about $8 \times 10^{15}$ atoms/cm$^3$. The lowly doped combination of P-region 34 and N regions 48 assures that substrate isolation junctions 36 have a sufficiently high breakdown voltage (typically about 30 volts).

An arrangement of conductors completes the PROM. Lying over each N+ region 42 is an N+ layer 50 of polycystalline silicon. Lying over N+ regions 28 and 50 and over P+ region 46 is a pattern of leads 54 consisting of aluminum with about 1% silicon. Leads $54_B$, $54_D$, and $54_F$ are column lines. Except for lead $54_C$ and its counterparts which connect to the row lines, all other leads 54 as shown by lead $54_D$ in FIG. 2b extend along the columns.

A second crossing path of leads of conventional design is employed to form the row lines and complete the arrangement of conductors. This second crossing pattern of leads has not been shown in the drawings so as to avoid unnecessary complexity. In employing the second pattern of leads, a layer of phosphorus-doped silicon dioxide (Vapox) lies over leads 54 and the portion of oxide region 16 between leads 54. The crossing pattern of leads consists of pure aluminum that overlies the Vapox layer and is connected to lead $54_C$ and its counterparts by way of aluminum-filled vias extending through the Vapox layer.

To program the PROM, a reverse current of about 40 ma is forced through each PN junction 30 that is to be destroyed. Where, for example, junction $30_D$ is to be destroyed, a suitable reverse voltage is applied between leads $54_C$ and $54_D$ for a suitable time which is typically less than one microsecond to cause avalanche breakdown in the programmable diode and generate the specified reverse current. The programmable diode heats up until the aluminum-silicon eutectic temperature of approximately 577° C. is reached. At this point, the programmable diode permanently short circuits as aluminum from lead $54_D$ migrates through N+ region $28_D$ to make ohmic contact with P region $24_D$. This places a logical "0" or a logical "1" in cell $12_D$ depending on the convention employed while cells 12 whose programmable diodes remain intact are in the opposite logical states.

FIGS. 3a-3m illustrate steps in manufacturing the PROM of FIGS. 1, 2a, and 2b. In the manufacturing process, boron is utilized as the P-type impurity for creating the various regions of P-type conductivity. Unless otherwise indicated, boron is ion implanted in the form of B+. Phosphorus, arsenic, and antimony are used selectively as the complementary N-type dopants. Unless otherwise indicated, they are implanted in the forms of P+, As+, and Sb+, respectively. Other appropriate impurities may be used in place of these dopants. In many of the ion implantation steps, the impurity may alternatively be introduced into the wafer by diffusion.

Conventional cleaning and photoresist masking techniques are employed in creating the various insulating, P-type, and N-type regions. To simplify the discussion, references to the cleaning steps, the steps involved in making a photoresist mask, and other such well known steps in the semiconductor art are omitted from the following description. Unless otherwise indicated, each etching of silicon dioxide is performed with a buffered etchant consisting approximately of 7 parts of 40% ammonium fluoride and 1 part of 49% hydrofluoric acid.

The initial steps in the process involve defining the locations for the composite buried layer consisting of N+ regions 32 and P+ web 44. Referring to FIG. 3a, the starting material is a semiconductor wafer containing a P-monocrystalline silicon substrate 60 having a resistivity of 7-21 ohm-cm and a thickness of about 500 microns. The wafer is subjected to an oxidizing atmosphere of oxygen and hydrogen at 1,000° C. for 360 minutes to grow a layer 62 of silicon dioxide having a thickness of approximately 1.2 microns along the upper surface of substrate 60. A photoresist mask 64 having openings generally above the locations intended for regions 32 and web 44 is formed on oxide layer 62. The exposed portions of oxide layer 62 are etched for 18 minutes to leave a thickness of 800–1,400 angstroms of silicon dioxide at the open areas in mask 64.

After removing mask 64, a non-critical photoresist mask 66 having a nominal thickness of 7,000 angstroms and having openings generally above the intended locations for tubs 32 is formed on the top surface of the wafer as shown in FIG. 3b. The exposed portions of the remainder of oxide layer 62 are etched for 3 minutes to reach the silicon in substrate 60. With mask 66 in place, antimony is implanted at a dosage of $2 \times 10^{15}$ ions/cm$^2$ and at an energy of 50 kiloelectron volts (KEV) through the open areas in the remainder of oxide layer 62 to form N+ regions 68.

After removing mask 66, the wafer is subjected to nitrogen for 20 minutes at 1,000° C., to oxygen and hydrogen for 13 minutes at 1,000° C. and to nitrogen for 75 minutes at 1,200° C. so as to establish registration depressions 70 at the exposed areas of substrate 60 as depicted in FIG. 3c by growing layers 72 of silicon dioxide having a thickness of approximately 2,400 angstroms. The high temperature of this step also drives the antimony in regions 68 further downward (and sideward) into substrate 60. A non-critical photoresist mask 74 having a nominal thickness of 1.2 microns and a web-type opening generally above the location intended for buried web 44 is formed on the top surface of the wafer. The exposed portions of the remainder of oxide layer 62 are etched for 3.5 minutes down to the silicon in substrate 60. With mask 74 in place, boron is implanted at a dosage of $2 \times 10^{14}$ ions/cm$^2$ and at an energy of 180 KEV into substrate 60 to form P+ regions 76.

After removing mask 74, the wafer is etched for 20 minutes to remove oxide layer 72 and the remaining portions of oxide layer 62 as shown in FIG. 3d. An arsenic-doped epitaxial layer 78 having a resistivity of about 0.7 ohm-cm is grown according to the well-known silane process to a thickness of approximately 1.75 microns on the exposed upper silicon surface. Regions 68 and 76 are now buried in the structure.

Oxide region 16 is now created. A layer 80 of silicon dioxide having a thickness of about 300 angstroms is first grown along the upper surface of epitaxial layer 78. This is accomplished by subjecting the wafer to dry oxygen at 1,000° C. for 11 minutes. A layer 82 of silicon nitride having a thickness of about 1,200 angstroms is deposited on oxide layer 80 according to a conventional low-pressure chemical vapor deposition process. The wafer is then subjected to oxygen and hydrogen at 1,000° C. for 120 minutes to form a thin layer 84 of silicon dioxide along the upper surface of nitride layer 82. As indicated in FIG. 3d, each registration depression 70 is reflected in layers 78, 80, 82, and 84. A photoresist mask 86 having a web-type opening corresponding to the intended location for insulation region 16 is formed on oxide layer 84. The exposed portion of oxide layer 84 is removed by etching for 1.5 minutes.

After removing mask 86, the exposed part of nitride layer 82 is removed down to oxide layer 80 as shown in FIG. 3e by etching with hot phosphoric acid at 165° C. for 35 minutes. The exposed part of oxide layer 80 is then removed down to epitaxial layer 78 by etching for 1 minute. The exposed part of epitaxial layer 78 is etched downward approximately 6,500 angstroms to form a groove 87. This is done for 5 minutes at 23° C. using an etchant consisting of 250 parts of 70% nitric acid, 40 parts of 49% hydrofluoric acid and 1,000 parts of acetic acid saturated with iodine.

Insulation region 16 having a depth of about 1.25 microns is now formed along groove 87 as shown in FIG. 3f by subjecting the wafer to oxygen and hydrogen at 1,000° C. for 360 minutes. Oxide region 16 does not extend into substrate 60 so that portions 48 of N epitaxial layer 78 lie directly below the lower surface of oxide region 16. During this high-temperature step, the boron in region 76 diffuses both downward into substrate 60 and upward into epitaxial layer 78 so as to define P+ web 44 which extends up the sidewalls of region 16. Likewise, the antimony in regions 68 diffuses downward somewhat into substrate 60 and upward somewhat into epitaxial layer 78 to define N+ buried regions 32. More particularly, the sections of the lower surface of oxide region 16 above tubs 32 is about 1,000 angstroms lower than the remainder of the lower surface of region 16 because of registration depressions 70. Buried regions 32 extend upward at least far enough to contact the lowest surface sections of region 16.

The remaining N-type portions of epitaxial layer 78 laterally adjoining oxide region 16 are used for cells 12 and connective regions 38 and 46. Each of these N-type monocrystalline portions intended for cells 12 has lateral dimensions of about 2 microns by 2 microns below bird beaks 18.

The remaining portions of oxide layer 84 (which grew slightly during the preceding high-temperature step) are removed as indicated in FIG. 3g by etching for 1.5 minutes. The remaining portions of nitride layer 82 are likewise removed by etching with hot phosphoric acid at 165° C. for 35 minutes. The remaining portions of oxide layer 80 are also removed by etching for 1 minute. An electrically insulating layer 88 of silicon dioxide having a thickness of approximately 1,000 angstroms is grown along the exposed portions of epitaxial layer 78 by subjecting the wafer to oxygen and hydrogen at 900° C. for 26 minutes. Because this oxidation is at a relatively low temperature, no significant redistribution of the impurities in tubs 32 and web 44 occurs. The formation of buried regions 32 and buried web 44 is largely complete.

Connective regions 38 and 46 as well as transistors in the peripheral circuitry are now laid out. A non-critical photoresist mask 90 having a nominal thickness of about 8,000 angstroms and open spaces above the intended locations for connective regions 38 is formed on the top of the wafer. The exposed portions of oxide layer 88 are removed by etching for 2 minutes. With mask 90 in place, phosphorus is implanted at a dosage of $3 \times 10^{15}$ ions/cm$^2$ and at an energy of 180 KEV into the exposed portions of epitaxial layer 78 to form N+ regions 92.

After removing mask 90, the wafer is annealed for 120 minutes at 1000° C. to repair lattice implant damage. The wafer is then subjectd to oxygen and hydrogen at 900° C. for 31 minutes to grow layers 94 of silicon dioxide having a thickness of about 1,400 angstroms at the exposed portions of epitaxial layer 78 as shown in FIG. 3h. During this oxidation step, oxide layers 88 increase about 1,000 angstroms in thickness. The phosphorus in regions 92 redistributes to expand them downward, and the boron in web 44 diffuses slightly upward. No significant redistribution of the antimony in tubs 32 occurs during these treatments.

A photoresist mask 96 having a nominal thickness of 1.2 microns and open spaces over the intended locations for P+ onnective regions 46 is formed on the top of the wafer. Mask 96 is non-critical with respect to regions 46. With mask 96 in place, boron is doubly implanted through the exposed portions of oxide layer 88 into the underlying portions of epitaxial layer 78 to form P+ regions 98. The first implant is at a dosage of $1 \times 10^{13}$ ions/cm$^2$ and at an energy of 180 KEV while the second implant is at a dosage of $1.5 \times 10^{14}$ ions/cm$^2$ and at an energy of 75 KEV.

Figure 3M:
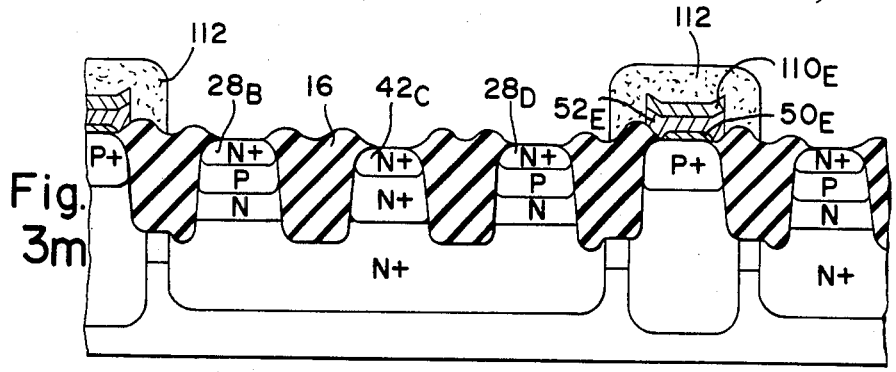
Figure 3N:
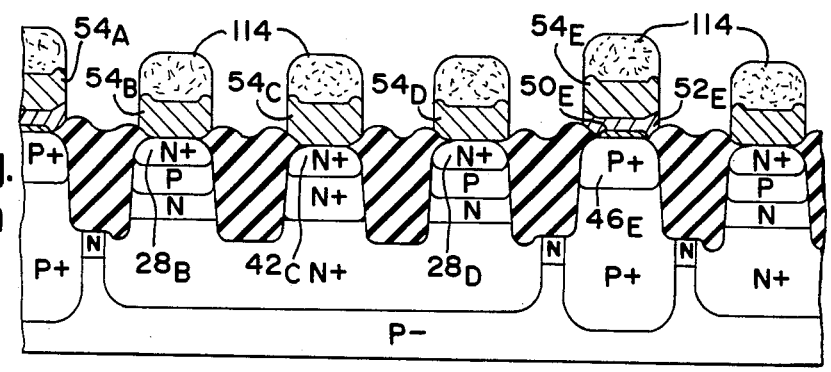
Figure 4:
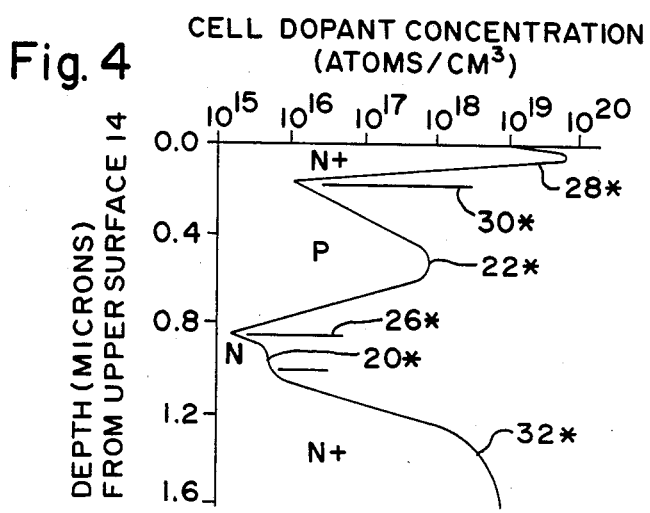
Figure 1:
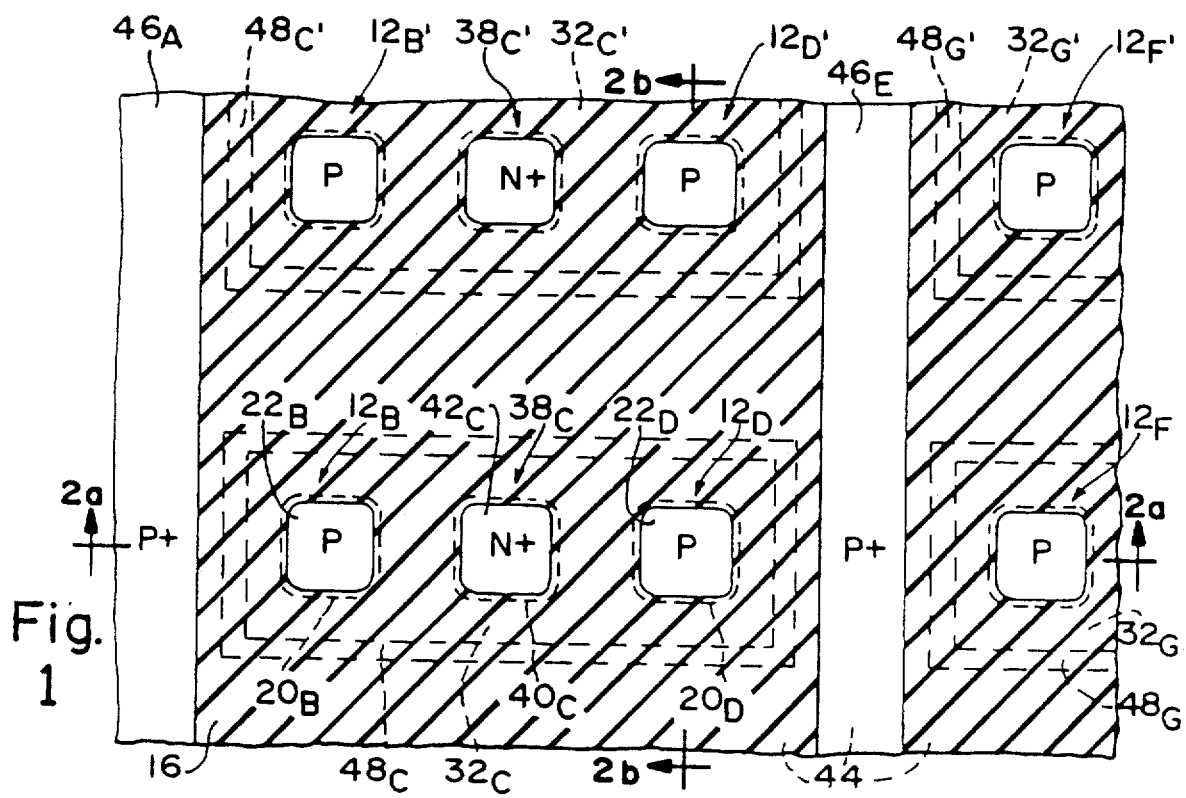
Figure 2A:
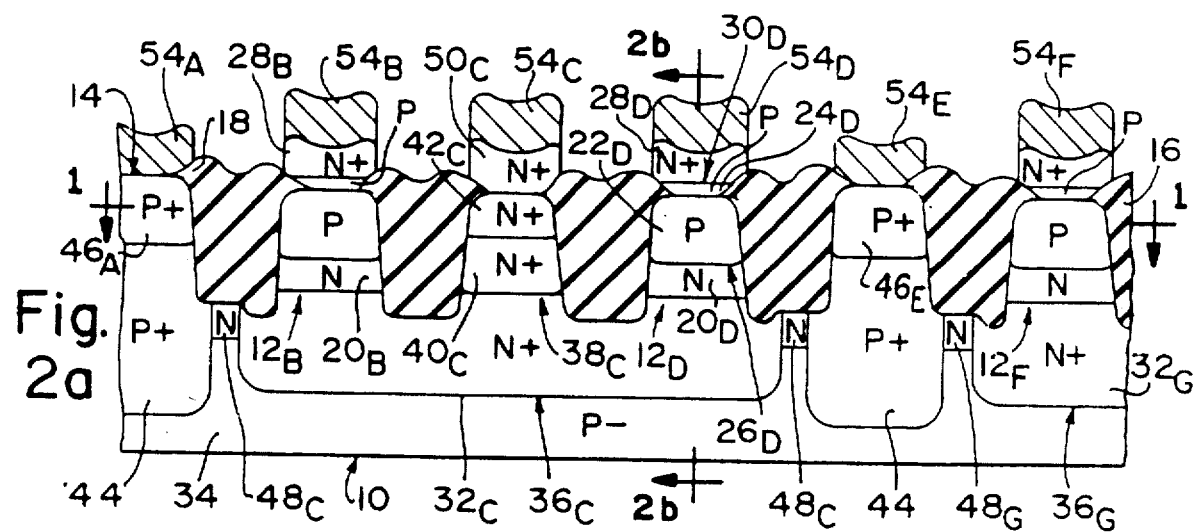
Figure 2B:
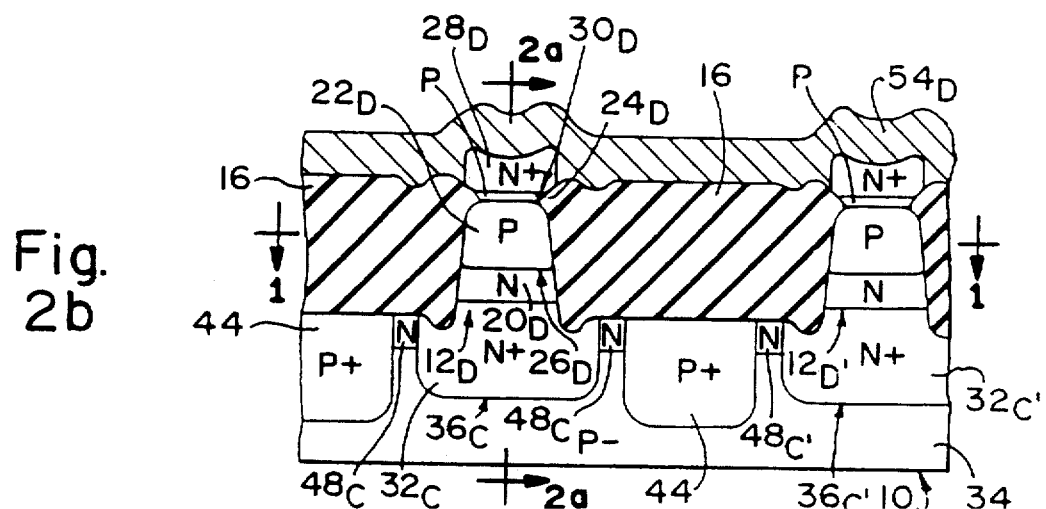
Figure 3I:
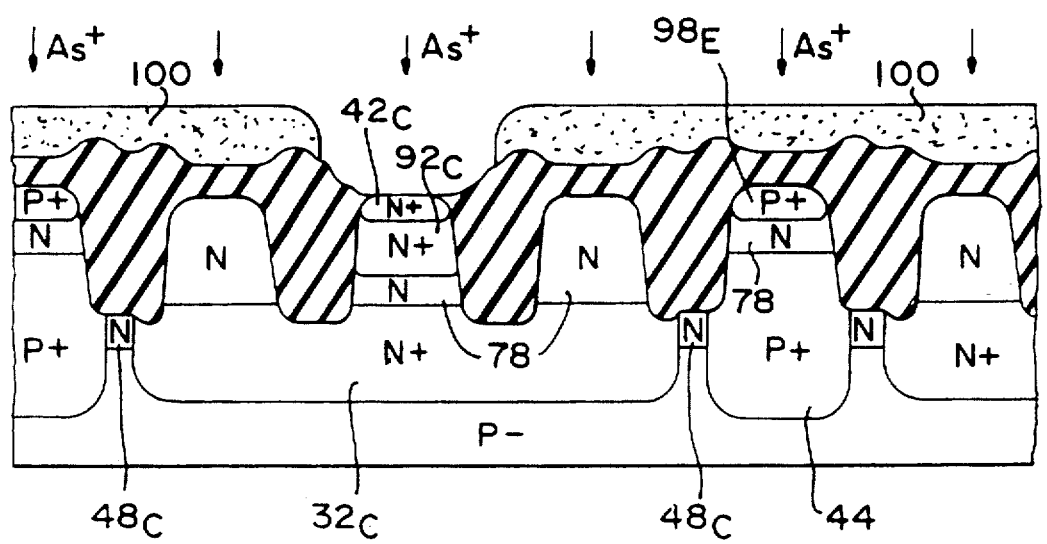

After removing mask 96, a photoresist mask 100 having a nominal thickness of 8,000 angstroms and openings above the intended locations for connective regions 38 is formed on the top of the wafer as shown in FIG. 3i. Mask 100 is non-critical with regard to regions 38. Oxide layers 94 are removed by etching for 4 minutes. N+ regions 42 are formed in upper portions of regions 92 by first deeply implanting arsenic at a dosage of $1 \times 10^{15}$ ions/cm$^2$ and at an energy of 180 KEV, removing mask 100, and then shallowly implanting arsenic at a dosage of $2 \times 10^{15}$ ions/cm$^2$ and at an energy of 50 KEV.

The wafer is annealed in nitrogen at 1,000° C. for 60 minutes to repair implant lattice damage and to cause the arsenic and boron in regions 42 and 98 to redistribute. As shown in FIG. 3j, regions 42 move downward. The boron in buried web 44 expands slightly outward, and regions 98 move downward to meet web 44 and become P+ connective regions 46. Regions 32 and 92 also grow slightly.

Next, the diodes in cells 12 are formed. A non-critical photoresist mask 102 having a nominal thickness of 1.2 microns and openings above the intended locations for the lower portions of cells 12 is formed on the top of the wafer. The exposed portions of oxide layers 88 are removed down to epitaxial layer 78 to partially expose upper surface 14. With mask 102 in place, boron is implanted into epitaxial layer 78 at a suitable dosage and energy to form P regions 22 and thus define PN junctions 26. In this implant, the sidewalls of insulation region 16 serve as a mask to control the lateral extent of the boron impurity and thereby the lateral extent of junctions 26.

After removing mask 102, a layer of intrinsic (undoped) polycrystalline silicon is formed to a suitable thickness (e.g., 2,000 angstroms) on the top of the wafer including over regions 22 and 42 along surface 14. An N-type impurity (e.g., arsenic) is implanted at such a dosage and energy that PN junctions 30 will ultimately lie about 500 angstroms above upper surface 14. A photoresist mask 10 whose polymerized photoresist generally overlies regions 22 and 42 is formed on the polycrystalline layer. The exposed portions of the polycrystalline layer are removed by etching with a conventional etchant (e.g., potassium hydroxide) so as to leave a composite polycrystalline region along surface 14 over each of regions 22 and 42 as shown in FIG. 3k. Each composite polycrystalline region consists of a lower intrinsic (undoped) polycrystalline part 106 and an upper N+ polycrystalline part 108.

After removing mask 104, the wafer is annealed at a relatively low temperature (e.g. 950° C.) in an inert atmosphere such as argon to repair the lattice damage caused by the implantation to form regions 22 (and 108). This anneal causes part of the boron in regions 22 to move sufficiently upward into the overlying polycrystalline silicon to meet the arsenic in the overlying ones of regions 108 and thereby form PN junctions 30 as shown in FIG. 3l. The lower parts of the polycrystalline silicon are now P regions 24 while the upper parts are N+ regions 28. Part of the phosphorus in regions 42 likewise moves upward into the overlying polycrystalline silicon to meet the arsenic in the overlying ones of regions 108 so as to form composite N+ regions 50. The arsenic in original regions 108 does not move significantly downward. This anneal causes P regions 22 to expand downward to their final positions, thereby leaving regions 20 as the remaining portions of N epitaxial layer 78 within cells 12. Regions 42 and 92 also expand slightly downward to their final positions where regions 92 become N+ regions 40 that meet the associated buried regions 28. Regions 46 likewise move downward slightly to their final positions. This annealing step completes the manufacture of the diodes in PROM cells 12 as well as connective regions 38 and 46.

The wafer is now ready for fabrication of the conductive leads which will contact regions 28, 50, and 46 along the top of the wafer. A non-critical photoresist mask 110 having openings above P+ regions 46 is formed along the top of the wafer. Oxide regions 88 are removed down to regions 46 by etching for 4 minutes with a suitable etchant.

After removing mask 110, a layer of aluminum is deposited to a suitable thickness (e.g., 7,000 angstroms) over the top of the wafer including over monocrystalline regions 42 and polycrystalline regions 28 and 50. The aluminum layer is then patterned to create leads 54 as shown in FIG. 3m by forming a photoresist mask 112 over the aluminum layer with polymerized photoresist overlying the aluminum over regions 28, 50, and 46 and then removing the exposed aluminum by etching with a suitable conventional etchant. Mask 112 is then removed to yield the structure shown in FIG. 2a (and in FIG. 2b).

As pointed out above, a second layer of aluminum leads is provided in a conventional manner. This is accomplished by depositing a layer of Vapox on the top of the wafer to a thickness of approximately 9,000 angstroms, etching vias down to selected ones of leads 54 using an appropriate photoresist mask, depositing a layer of pure aluminum on the Vapox and over the selected leads 54, and then patterning this aluminum layer using another photoresist mask to complete the PROM.

While the invention has been described with reference to a particular embodiment, this description is solely for the purpose of illustration and is not to be construed as limiting the scope of the invention claimed below. For example, the connective regions for the composite buried layer could be laid out after the diodes in the PROM cells are laid out. Alternatively, the connective regions for the composite buried layer and the diodes for the PROM cells might be laid out using largely the same implantation/diffusion steps. Materials and dopants of opposite conductivity type may be used in place of those described above. Thus, various modifications, changes, and applications may be made by those skilled in the art without departing from the true scope and spirit of the invention as defined by the appended claims.

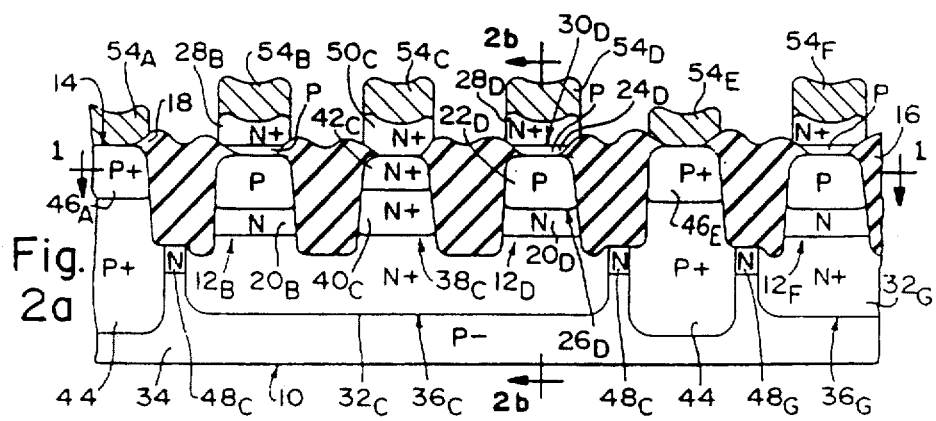

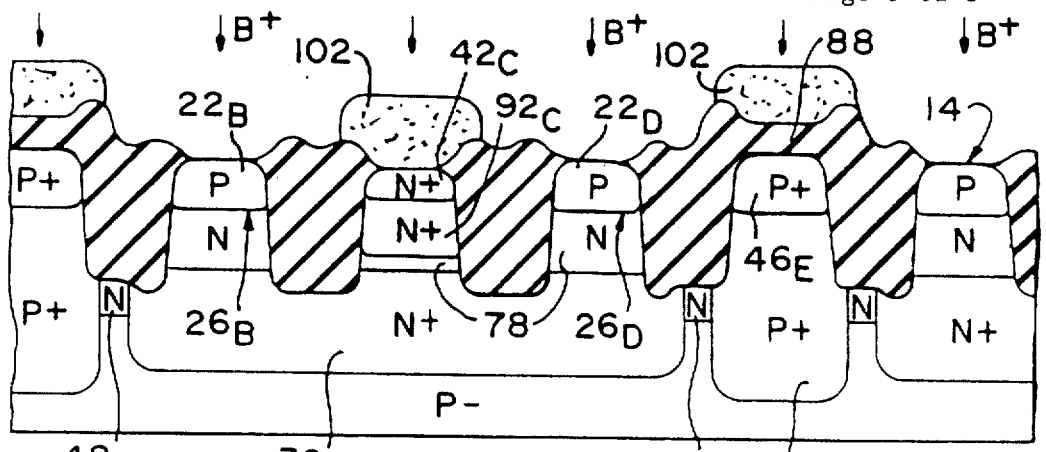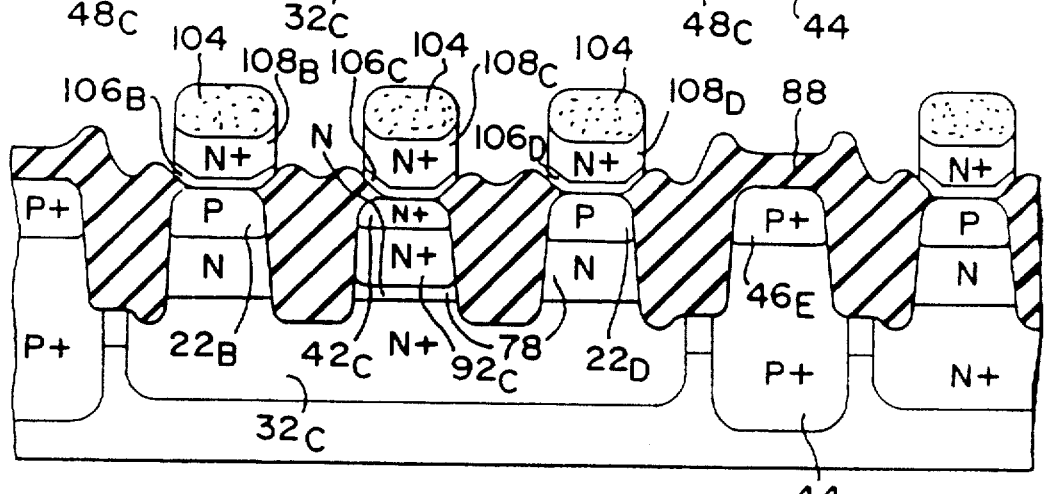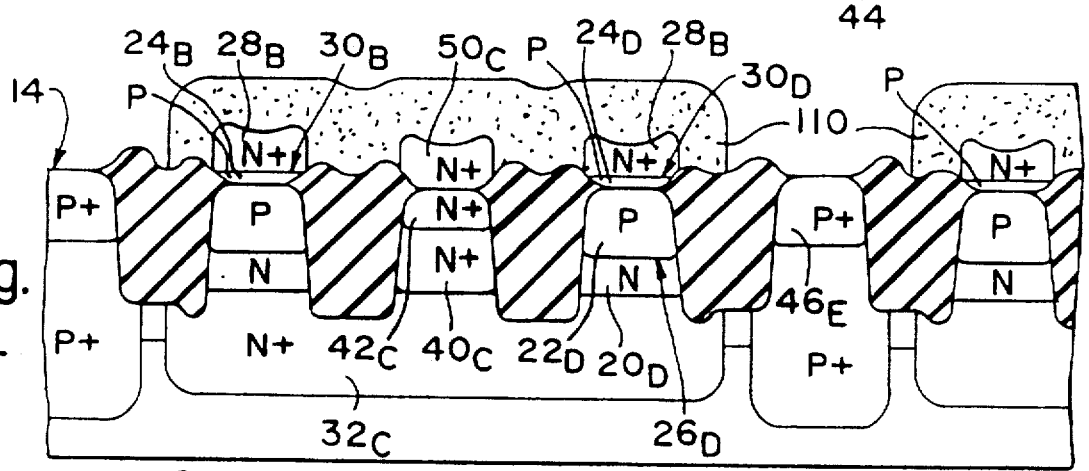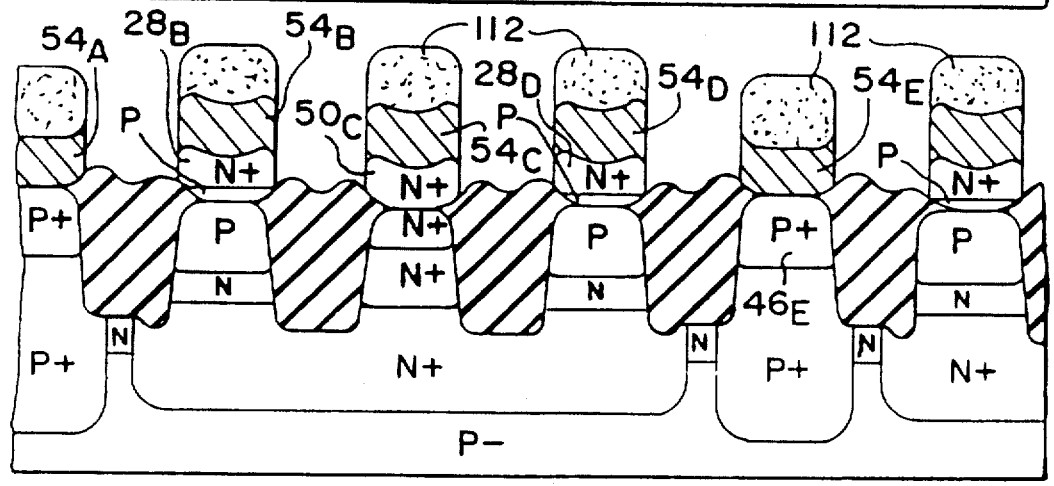

What is claimed is:

1. A programmable read-only memory (PROM) in a semiconductor body containing a recessed electrically insulating region and an adjoining monocrystalline semiconducting region having an upper surface along which a group of PROM cells are laterally spearated from one another, each cell having a substantially horizontal first PN junction and a corresponding second PN junction that together form a pair of PN junction diodes connected to each other in an opposing configuration, the first PN junction for each cell lying in the semiconducting region and being formed by the upper boundary of a lower region of a first conductivity type in that cell, the edge of each first PN junction fully adjoining the insulating region, characterized in that:

each second PN junction is substantially horizontal and lies in a corresponding substantially non-monocrystalline further region of the body downwardly adjoining the semiconducting region above the corresponding first PN junction, the edge of each second PN junction fully adjoining the insulating region which extends at least partly above the upper surface such that there is an intermediate region common to each pair of diodes between their PN junctions for which the portion of the boundary of the intermediate region extending between the edges of the PN junctions fully adjoins the insulating region;

the PROM includes a plurality of more highly doped buried regions of the first conductivity type laterally spaced apart from one another, each associated with at least one of the lower regions, being upwardly continuous with each associated lower region, and adjoining the insulating region along the entire lower edge of the lateral periphery of each associated lower region; and the PROM further includes a like plurality of connective regions of the first conductivity type, each extending from a different one of the buried regions to the upper surface.

2. A PROM as in claim 1 characterized in that each further region is substantially polycrystalline semiconductor material.

3. A PROM as in claim 1 characterized in that each first PN junction is an array element and that each second PN junction is a programmable element.

4. A PROM as in claim 3 characterized in that the insulating region is a semiconductor oxide.

5. A PROM as in claim 1 characterized in that each cells necks laterally down at the upper surface.

6. A PROM as in claim 1 characterized in that the average net dopant concentration in the buried regions is at least two orders of magnitude greater than the average net dopant concentration in the lower regions.

7. A PROM as in claim 1 characterized by a buried web of a second conductivity type opposite to the first conductivity type laterally surrounding each buried region.

8. A PROM as in claim 7 characterized by a lowly doped region continuous with the buried regions and the buried web and extending along their entire lateral peripheries up to the insulating region to separate the buried web from the buried regions.

9. A PROM as in claim 8 characterized in that the average net dopant concentration in the buried web and the buried regions is at least an order of magnitude greater than the average net dopant concentration in the lowly doped region.

10. A PROM as in claim 9 characterized by at least one connective region of the second conductivity type extending from the buried web to the upper surface.

11. A PROM as in claim 3 characterized in that said boundary portion of each intermediate region substantially laterally adjoins the insulating region.

12. A PROM as in claim 11 characterized in that the lateral area of each first PN junction significantly exceeds the lateral area of the corresponding second PN junction.

13. A PROM as in claim 1 characterized in that each second PN junction lies significantly above the upper surface so as to be spaced apart from the semiconducting region.

14. A PROM as in claim 13 characterized in that each second PN junction is about 500 angstroms above the upper surface.

15. A programmable read-only memory (PROM) in a semiconductor body containing a recessed electrically insulating region and an adjoining monocrystalline semiconducting region having an upper surface along which a group of PROM cells are laterally separated from one another, each cell having a substantially horizontal first PN junction and a corresponding second PN junction that together form a pair of PN junction diodes connected to each other in an opposing configuration, the first PN junction for each cell lying in the semiconducting region and being formed by the upper boundary of a lower region of a first conductivity type in that cell, the edge of each first PN junction fully adjoining the insulating region, characterized in that:

each second PN junction is substantially horizontal and lies in a corresponding substantially non-monocrystalline further region of the body downwardly adjoining the semiconducting region above the corresponding first PN junction, the edge of each second PN junction fully adjoining the insulating region which extends at least partly above the upper surface such that there is an intermediate region common to each pair of diodes between their PN junctions for which the portion of the boundary of the intermediate region extending between the edges of the PN junctions fully adjoins the insulating region; and the PROM includes a plurality of more highly doped buried regions of the first conductivity type laterally spaced apart from one another, each associated with at least two of the lower region, being upwardly continuous with each associated lower region, and adjoining the insulating region along the entire lower edge of the lateral periphery of each associated lower region.

16. A PROM as in claim 15 characterized by a like plurality of connective regions of the first conductivity type, each extending from a different one of the buried regions to the upper surface.

17. A PROM as in claim 16 characterized by a buried web of a second conductivity type opposite to the first conductivity type laterally surrounding each buried region.

18. A PROM as in claim 15 characterized in that each further region is substantially polycrystalline semiconductor material.

19. A PROM as in claim 18 characterized in that each first PN unction is an array element and that each second PN junction is a programmable element.

20. A PROM as in claim 18 characterized in that the insulating region is a semiconductor oxide.

* * * * *

UNITED STATES PATENT AND TRADEMARK OFFICE
CERTIFICATE OF CORRECTION

PATENT NO. : 4,727,409                                    Page 1 of 5

DATED      : 23 February 1988

INVENTOR(S) : George W. Conner and Ronald L. Cline

It is certified that error appears in the above-identified patent and that said Letters Patent is hereby corrected as shown below:

The title page should be deleted to appear as per attached title page.

Delete drawing sheets 1, 4, and 5 and, in their place, substitute the attached three sheets as drawing sheets 1, 4, and 5.

Signed and Sealed this

Twenty-second Day of October, 1991

Attest:

HARRY F. MANBECK, JR.

*Attesting Officer*   *Commissioner of Patents and Trademarks*

United States Patent [19]

Conner et al.

[11] Patent Number: 4,727,409
[45] Date of Patent: Feb. 23, 1988

[54] PROGRAMMABLE READ-ONLY MEMORY FORMED WITH OPPOSING PN DIODES

[75] Inventors: George W. Conner, Ben Lomond; Ronald L. Cline, Los Gatos, both of Calif.

[73] Assignee: Signetics Corporation, Sunnyvale, Calif.

[21] Appl. No.: 763,063

[22] Filed: Aug. 5, 1985

Related U.S. Application Data

[63] Continuation of Ser. No. 367,500, Apr. 12, 1982, abandoned.

[51] Int. Cl.⁴ ............................................. H01L 29/04
[52] U.S. Cl. ...................................... 357/59; 365/96; 365/103; 365/105
[58] Field of Search ............... 357/59 A; 365/96, 103, 365/105

[56] References Cited

U.S. PATENT DOCUMENTS

| 3,992,232 | 11/1976 | Kaji et al. | 357/50 |
| 4,099,260 | 7/1978 | Lynes et al. | |
| 4,198,649 | 4/1980 | Berry | 357/49 |
| 4,229,757 | 10/1980 | Moussie | 365/105 |
| 4,403,399 | 9/1983 | Taylor | 357/45 |
| 4,418,468 | 12/1983 | Vora et al. | 357/50 |
| 4,480,318 | 10/1984 | Chong | 365/105 |
| 4,624,046 | 11/1986 | Shideler | 357/34 |

FOREIGN PATENT DOCUMENTS

| 7632739 | 5/1978 | France | |
| 0127061 | 10/1980 | Japan | 357/50 |
| 56-24968 | 3/1981 | Japan | 365/103 |
| 0048170 | 5/1981 | Japan | 357/50 |
| 0083058 | 7/1981 | Japan | 357/45 |
| 2005079 | 4/1979 | United Kingdom | |

OTHER PUBLICATIONS

IBM Tech. Disclosure Bulletin, vol. 23, #12, pp. 5388-5389, May 1981, by Jambotkas.
Electronics, Feb. 28, 1982, "16K-PROM Uses Vertical Fuses", p. 184.
M. Grossman, "Recessed-Oxide Isolation Hikes IBM's LSI Density and Speed", *Electronic Design*, Jun. 7, 1979, pp. 26-28.

*Primary Examiner*—Andrew J. James
*Assistant Examiner*—Mark Prenty
*Attorney, Agent, or Firm*—R. J. Meetin; R. T. Mayer; J. Oisher

[57] ABSTRACT

A semiconductor PROM contains a group of PROM cells (12) each consisting of a pair of opposing diodes oriented vertically with their common intermediate region (22 and 24) fully adjoining a recessed oxide insulating region (16). The PN junction (30) of the upper diode of each pair lies in non-monocrystalline semiconductor material. A composite buried layer consisting of buried regions (32) which adjoin the insulating region below the lower cell regions (20) and a buried web (44) which laterally surrounds each buried region is employed to improve programming efficiency as well as provide intermediate electrical connections.

20 Claims, 16 Drawing Figures